United States Patent
Gradinariu et al.

(10) Patent No.: US 6,530,040 B1
(45) Date of Patent: Mar. 4, 2003

(54) PARALLEL TEST IN ASYNCHRONOUS MEMORY WITH SINGLE-ENDED OUTPUT PATH

(75) Inventors: Iulian C. Gradinariu, Colorado Springs, CO (US); John J. Silver, Monument, CO (US); Keith A. Ford, Colorado Springs, CO (US); Sean B. Mulholland, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/401,614

(22) Filed: Sep. 22, 1999

(51) Int. Cl.[7] ............................................... G06F 11/26
(52) U.S. Cl. ........................................ 714/42; 714/718
(58) Field of Search ......................... 714/42, 718, 719; 365/200, 201, 220

(56) References Cited

U.S. PATENT DOCUMENTS

| | | | | |
|---|---|---|---|---|
| 5,383,157 A | * | 1/1995 | Phelan | 365/189.05 |
| 6,111,800 A | * | 8/2000 | Allan et al. | 365/189.02 |
| 6,163,495 A | * | 12/2000 | Ford et al. | 365/230.03 |

* cited by examiner

*Primary Examiner*—Scott Baderman
(74) *Attorney, Agent, or Firm*—Wagner Murabito & Hao LLP

(57) ABSTRACT

An asynchronous memory device includes parallel test circuitry configured to interface with a single-ended output data path of the memory device and, in some cases, to provide a measure of a slowest cell access time for the memory device. The parallel test circuitry may include first circuitry configured to receive logic signals from a plurality of cells of the memory device and to provide first output signals indicative of logic states of the plurality of cells; and second circuitry configured to receive the first output signals and to produce a second output signal indicative of the logic states of the first output signals therefrom. For example, the first circuitry and the second circuitry may be configured as a wired NAND and wired NOR combination. In some cases, one or more of the cells may be included within a redundant row or column of the memory device. The first circuitry may include one or more circuits, each including an input path from a first number of the plurality of cells and configured to provide at least one of the first output signals. The second circuitry may include logic circuitry configured to receive the first output signals and a control signal and to provide the second output signal. For example, the second circuitry may include an exclusive OR circuit coupled to receive the first output signals and to produce the second output signal.

4 Claims, 4 Drawing Sheets

PARALLEL TEST IN ASYNCHRONOUS MEMORY WITH SINGLE-ENDED OUTPUT PATH

FIELD OF THE INVENTION

The present invention relates to memory devices, and, in particular, those devices which employ parallel test features.

BACKGROUND

Conventional memory devices, for example static random access memories (SRAMs) and dynamic random access memories (DRAMs), as are commonly used in computer systems, often include parallel test features. Such features allow a manufacturer to test the memory cells of the device more quickly. In general, each cell of the memory device is tested to determine whether it is functioning properly (i.e., whether it is properly retaining a stored state). For large memories (e.g., on the order of 1 Megabit or more), parallel testing allows multiple cells (or bits) of the memory to be tested at the same time. For example, instead of having to test each cell individually, parallel test features incorporated into the memory or other programmable device may allow a manufacturer to test four, eight, sixteen, etc. cells at a time, thus reducing the overall test time for the device (a factor which has been recognized as being a significant portion of the overall production costs of a memory device).

Although such "functional" (e.g., pass/fail) parallel testing for memory devices has been available (see, e.g., U.S. Pat. No. 5,383,157 entitled Parallel Testmode, assigned to the assignee of the present invention, the entire disclosure of which is incorporated herein by reference), such testing often provides no indication of the so-called critical path timing of the device under test in the case of an asynchronous memory. The "critical path" is the path through the device which determines the access time. For synchronous memory devices, the presence of input and output registers that are under the control of a common clock signal tends to set the timing parameters rather than the performance of any test circuitry. To illustrate, consider the synchronous memory 10 shown in FIG. 1. Input data 12 is applied to the input port of an input register 14 and is latched in the input register 14 in response to a clock signal 16. The data from input register 14 is written to a number of selected cells (e.g., four cells) of memory core 18 and the selected cells are programmed to retain the state of the data in signal 12. To test the functionality of the selected cells, the state of these cells is read by output register/test circuit 20 in response to a subsequent clock signal 16. Output register/test circuit 20 determines whether the state of each of the cells agrees with the state of the input data signal 12 and provides an indication of same as data out signal 22. Thus, data out signal 22 provides an indication as to whether there were any functional failures of the selected cells of memory core 18.

The signals from memory core 18 are latched in output register/test circuit 20 in response to clock signal 16 before they are tested. Thus, even the slowest of these signals has a predetermined time to set up before it is tested. Any timing differences between these signals is effectively masked by clock signal 16. Thus it can be seen that it is possible to easily add test circuitry to synchronous memories without impacting access, or clock to data output, time. In the case of asynchronous memories, the test circuitry itself must be configured to ensure that critical path timing is unaffected when test modes are invoked.

In a related and co-pending application entitled "Parallel Test For Asynchronous Memory", Application No. 08/985, 890, filed Dec. 5, 1997, by James Allen, John Silver and Keith Ford and assigned to the Assignee of the present invention, the complete disclosure of which is hereby incorporated by reference, an asynchronous memory with parallel test circuitry configured to provide a measure of a slowest bit access time for the device was described. This parallel test circuitry included first circuitry configured to receive logic signals from a plurality of memory cells and to provide first output signals indicative of logic states of the plurality of those cells. The parallel test circuitry also included second circuitry configured to receive the first output signals and to produce second output signals indicative of logic states of the first output signals therefrom. In one example, such parallel test circuitry was configured for use in the read path of the memory device, thus allowing the second output signals to be produced at the slowest bit access time.

FIG. 2 illustrates an asynchronous memory device 50 configured in accordance with the invention described in the above-cited co-pending application. Memory 50 is configured with parallel test circuitry which, as indicated above, can significantly reduce the time required to test the memory cells thereof and provide a measure of the access time of a slowest cell or bit. For this embodiment, memory 50 includes a memory core 52 arranged as North and South blocks, each block having a Far and a Middle quarter. Thus, memory core 52 includes Far North quarter 54, Middle North quarter 56, Middle South quarter 58 and Far South quarter 60. Also included in memory core 52 are North and South redundant blocks 62 and 64, respectively. North and South redundant blocks 62 and 64 (which may be arranged as redundant rows and/or columns) include memory cells which may be used to replace defective memory cells located in other quarters of memory core 52. Although not shown in individual detail, it should be appreciated that memory core 52 is made up of a number of individual memory cells, which may be conventional SRAM cells.

During a parallel test operation, test data is written to selected cells of memory core 52 by simultaneously activating multiple memory blocks, for example as described in U.S. Pat. No. 5,383,157. The data stored in these selected cells is read out and compared to the expected state as applied by the tester. This provides the functional test of the cells.

The parallel test circuitry for accomplishing the parallel test includes Far-Middle Multiplexers (FM MUX) 66a–66d and North-South Multiplexers (NS MUX) 68a–68b. In this context, the term multiplexer is used to describe the actions of the FM MUXs 66a–66d which receive logic signals from selected cells of respective quarters of memory core 52 and provide output signals indicative of the logic states of these cells. For example, FM MUX 66a may receive logic signal LQFN from a selected cell within Far- North quarter 54 and logic signal LQMN from a selected cell within Middle-North quarter 56. The logic complements of these signals (e.g., $\overline{\text{LQFN}}$ and $\overline{\text{LQMN}}$) are received by FM MUX 66c. Logic signals LQFN and $\overline{\text{LQFN}}$ correspond to the true and complement states of a selected memory cell within Far-North quarter 54 (e.g., as may be provided to true and complement bit lines coupled to a conventional SRAM cell). Similarly, logic signals LQMN and $\overline{\text{LQMN}}$ correspond to the true and complement states of a selected cell in Middle-North quarter 56. Thus, each FM MUX 66a and 66c receives true or complement, respectively, logic signals from selected cells of Far- and Middle-North quarters 54 and 56.

Because the same data is written to the selected cells of Far- and Middle-North quarters 54 and 56, the logic states of signals LQFN and LQMN should be the same when read by FM MUX 66a. That is, if a logic "1" is written to the selected cells, signals LQFN and LQMN should both indicate that a "1" was stored in the selected cells when these signals are read by FM MUX 66a (at least if these selected cells are functioning properly). Similarly, the logic states of signals $\overline{\text{LQFN}}$ and $\overline{\text{LQMN}}$ should be the same when read by FM MUX 66c. The output signals GQN and $\overline{\text{GQN}}$ produced by FM MUX 66a and 66c, respectively, are indicative of the logic states of the selected cells which provided logic signal pairs LQFN/$\overline{\text{LQFN}}$ and LQMN/$\overline{\text{LQMN}}$.

In a similar fashion, FM MUX 66b provides output signal GQS from logic signals LQMS and LQFS. FM MUX 66d provides output signal $\overline{\text{GQS}}$ from logic signals $\overline{\text{LQMS}}$ and $\overline{\text{LQFS}}$. Logic signal pair LQMS/$\overline{\text{LQMS}}$ corresponds to a selected cell in Middle-South quarter 58 while logic signal pair LQFS/$\overline{\text{LQFS}}$ corresponds to a selected cell in Far-South quarter 60.

Where redundancy is used, any of the logic signals LQFN or LQMN may be replaced by a logic signal RQN from redundant block 62. In such a case, corresponding logic signals $\overline{\text{LQFN}}$ or $\overline{\text{LQMN}}$ will be replaced by logic signal $\overline{\text{RQN}}$. Similarly, if redundancy is used in the South block of memory core 52, any of signals LQMS or LQFS may be replaced by signal RQS and a corresponding signal $\overline{\text{RQS}}$ will replace any of logic signals $\overline{\text{LQMS}}$ or $\overline{\text{LQFS}}$.

Signals GQN and GQS are provided to NS MUX 68a which is configured to produce an output signal $\overline{\text{CQ}}$. Output signal $\overline{\text{CQ}}$ is indicative of the logic states of signals GQN and GQS and is not merely a selection of one of these signals. Likewise,. NS MUX 68b receives signals $\overline{\text{GQN}}$ and $\overline{\text{GQS}}$ and produces output signal CQ which is indicative of the logic states of $\overline{\text{GQN}}$ and $\overline{\text{GQS}}$.

Signals CQ and $\overline{\text{CQ}}$ are applied as input signals to output driver 70 which includes n-channel transistors 72 and 74. Output driver 70 is activated in response to these input signals and, depending on the respective states of these signals, will either drive the logic state of output pin 76 high or low (i.e., to a logic "1" or "0"). In some cases, where signals CQ and $\overline{\text{CQ}}$ are both at logic low, pin 76 will be undriven and therefore in a high impedance state. These various voltage levels (high, low and high impedance) are indicative of whether the selected cells of memory core 52 accessed during the parallel test have functioned correctly (e.g., have stored the proper state of the test signal) or have failed. Where each of the four selected cells have stored the same logic state, a logic 1 or 0 (depending on the logic state of the signal written to the selected cells) will be obtained at pin 76. Where one of the cells has stored a different logic state than the others, pin 76 will be set to high impedance. To determine which of the cells has stored the different logic state (i.e., which of the cells failed), each of the four selected cells may be tested on an individual basis, as in conventional testing operations.

Because FM MUXs 66a–66d and NS MUXs 68a–68b also form part of the regular read path circuitry for memory 50, the speed at which an output signal appears at pin 76 in response to a read command during the parallel test is the same as for a regular read operation. Thus, the parallel test circuitry is automatically configured to provide a measure of the slowest cell or bit access time of memory core 52. Between accesses of different locations, the output at pin 76 is set to high impedance (e.g., using circuitry not shown). In response to a read command (e.g., as indicated using conventional read and/or chip select signals), a timer may be started. The time which elapses from the moment the read command is initiated to the point at which the voltage at pin 76 is recognized as a logic 1 or 0 (which need not necessarily be a full rail voltage) is the time for the slowest bit of the four selected cells. For the entire memory 50, the slowest such time for all of the cells of memory core 52 may be regarded as the read access time of the memory 50.

A complete parallel test sequence is accomplished as follows. First, selected cells in each of the quarters 54, 56, 58 and 60 are written with data. For example, the cells may be written with a logic 1. The selected cells are then tested by reading out the stored values from the selected cells using the above described parallel test circuitry. For example, assuming all of the selected cells properly stored a logic 1, and no redundancy was used, signals LQFN, LQMN, LQMS and LQFS will each be logic high. Thus, the respective output signals GQN and GQS of FM MUXs 66a and 66b will be logic high. Signals GQN and GQS will be received by NS MUX 68a which will produce a logic low output signal $\overline{\text{CQ}}$. The logic low output signal $\overline{\text{CQ}}$ is buffered and applied to the gate of transistor 74, turning this transistor off and decoupling pin 76 from the voltage source ground.

At the same time, signals $\overline{\text{LQFN}}$, $\overline{\text{LQMN}}$, $\overline{\text{LQFS}}$ and $\overline{\text{LQMS}}$ are logic low. These signals are received by FM MUXs 66c and 66d which produce logic low output signals $\overline{\text{GQN}}$ and $\overline{\text{GQS}}$ in response. Signals $\overline{\text{GQN}}$ and $\overline{\text{GQS}}$ are received by NS MUX 68b which produces logic high output signal CQ in response. Logic high output signal CQ is buffered and is applied to the gate of transistor 72, turning on this transistor and ulling the voltage at pin 76 to a logic high potential. A valid logic potential on pin 76 indicates that all four selected cells in memory core 52 have stored this same logic state. Thus a CQ or $\overline{\text{CQ}}$ signal can only reach a logic "1" if both of the input logic signals to be compared are at "0". Now since all the global data lines, GQ, $\overline{\text{GQ}}$ go high between data transitions, it is the later of the lines to transition to "0" which determines the speed of the CQ/$\overline{\text{CQ}}$ combined data lines. Also since the output pad 76 is at high impedance or undriven between transitions it is the CQ or $\overline{\text{CQ}}$ signal going high which drives the output pad to a "1" or a "0" at the access time of the slowest bit. These cells would pass the functional or timing test if this state matches the state expected by the tester 112.

Tester 112 may be a conventional SRAM test device. These testers commonly couple the output pins of a memory device under test to a test voltage (e.g., $V_{test}$). The test voltage is set at a voltage potential (e.g., 1.73V). If the selected cells of memory core 52 all store the same logic state, the voltage at pin 76 will be pulled to a logic high or low potential (as described above). However, if one or more of the selected cells stores an incorrect logic state, transistors 72 and 74 will both be off, and the voltage at pin 76 will remain at approximately 1.73V. This is an indication that at least one of the cells has failed to store the correct logic state and that each of the cells currently undergoing testing should be individually tested to determine which has/have failed. Note that if all 4 cells have the wrong state the output will be driven to this same state. This will be detected by the tester as the opposite of the expected data.

One potential drawback of the above-described scheme is that it requires the use of double-ended-busses in the output data path in order to be able to encode a logic "1" (all bits "1"), logic "0" (all bits "0") or tri-state (i.e., high impedance) (bits disagree) at the output. Such double-ended busses are simply not available in asynchronous memories that are configured with single-ended output data paths, as may be employed in ultra low power applications. Moreover, the above architecture requires the use of "N" bus slots in the periphery of the memory device to allow a comparison of adjacent memory areas. This yields a so-called $2^N$ folding factor (the folding factor represents the number of groups into which a memory array is divided in a scheme where the array is partitioned into blocks and the blocks are grouped together). Where "N" exceeds approximately 4, this represents a significant number of metal line slots to be run to the periphery on a die and becomes prohibitive. Thus, what is needed is a parallel test scheme for asynchronous memory devices with single-ended output data paths that combines pass/fail and multiple bit XOR functions.

SUMMARY OF THE INVENTION

In one embodiment, an asynchronous memory device includes parallel test circuitry configured to interface with a single-ended output data path of the memory device and, in some cases, to provide a measure of a slowest cell access time for the memory device. The parallel test circuitry may include first circuitry configured to receive logic signals from a plurality of cells of the memory device and to provide first output signals indicative of logic states of the plurality of cells; and second circuitry configured to receive the first output signals and to produce a second output signal indicative of the logic states of the first output signals therefrom. For example, the first circuitry and the second circuitry may be configured as a wired NAND and wired NOR combination. In some cases, one or more of the cells may be included within a redundant row or column of the memory device.

The first circuitry may include one or more circuits, each including an input path from a first number of the plurality of cells and configured to provide at least one of the first output signals. The second circuitry may include logic circuitry configured to receive the first output signals and a control signal and to provide the second output signal. For example, the second circuitry may include an exclusive OR circuit coupled to receive the first output signals and to produce the second output signal.

In a further embodiment, a parallel test method is provided. The method includes reading a plurality of cells of an asynchronous memory device having a single-ended output data path in parallel; and producing an output signal indicative of a logical combination of logic states of the plurality of cells. The output signal may be produced at an access speed of the slowest of the plurality of cells. In general, producing the output signal involves receiving logic signals from the plurality of cells and providing first output signals indicative of logic states of the plurality of cells. Then, the first output signals may be received and a second output signal indicative of the logic states of the first output signals produced therefrom.

In yet another embodiment parallel test circuitry includes an input path configured to receive logic signals from cells of an asynchronous memory device having a single-ended output data path; and logic circuitry coupled to the input path and configured to produce an output signal indicative of logic states stored in the cells. The input path may include a plurality of logic gates coupled to receive logic signals from the cells and one or more internal control signals of the asynchronous memory device, and driver transistors coupled the logic gates. The logic circuitry may include an exclusive OR gate.

BRIEF DESCRIPTION OF THE DRAWINGS

The present invention is illustrated by way of example and not limitation in the figures of the accompanying drawings in which.

DETAILED DESCRIPTION

Described herein is a parallel test scheme for asynchronous memory devices having single-ended output data paths. The present scheme allows for functional and critical path timing testing of memory cells of such a device and is transparent to redundancy. Although primarily described with reference to an asynchronous SRAM, the present parallel test scheme is generally applicable for use in a variety of asynchronous memory devices. For example, the present scheme may find application in programmable logic devices which use SRAM or other memory cells. In addition, processors which include on-chip and/or off-chip cache memories may utilize the present scheme where such cache memories are asynchronous in nature. Accordingly, the following description should be regarded as illustrative (and not restrictive) in nature.

Figure 1:
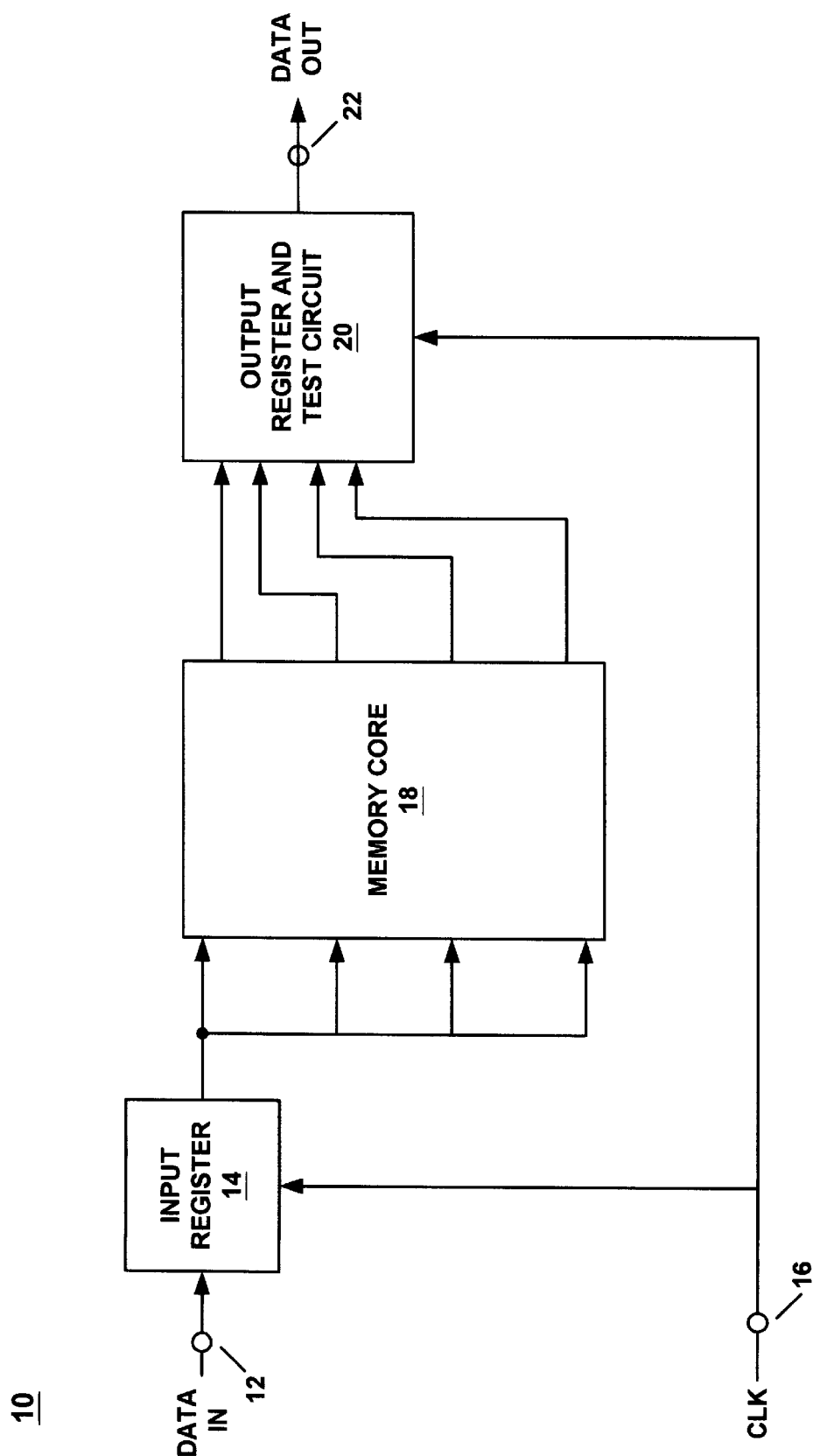
FIG. 1 illustrates a conventional parallel test scheme for a synchronous memory device.
Figure 2:
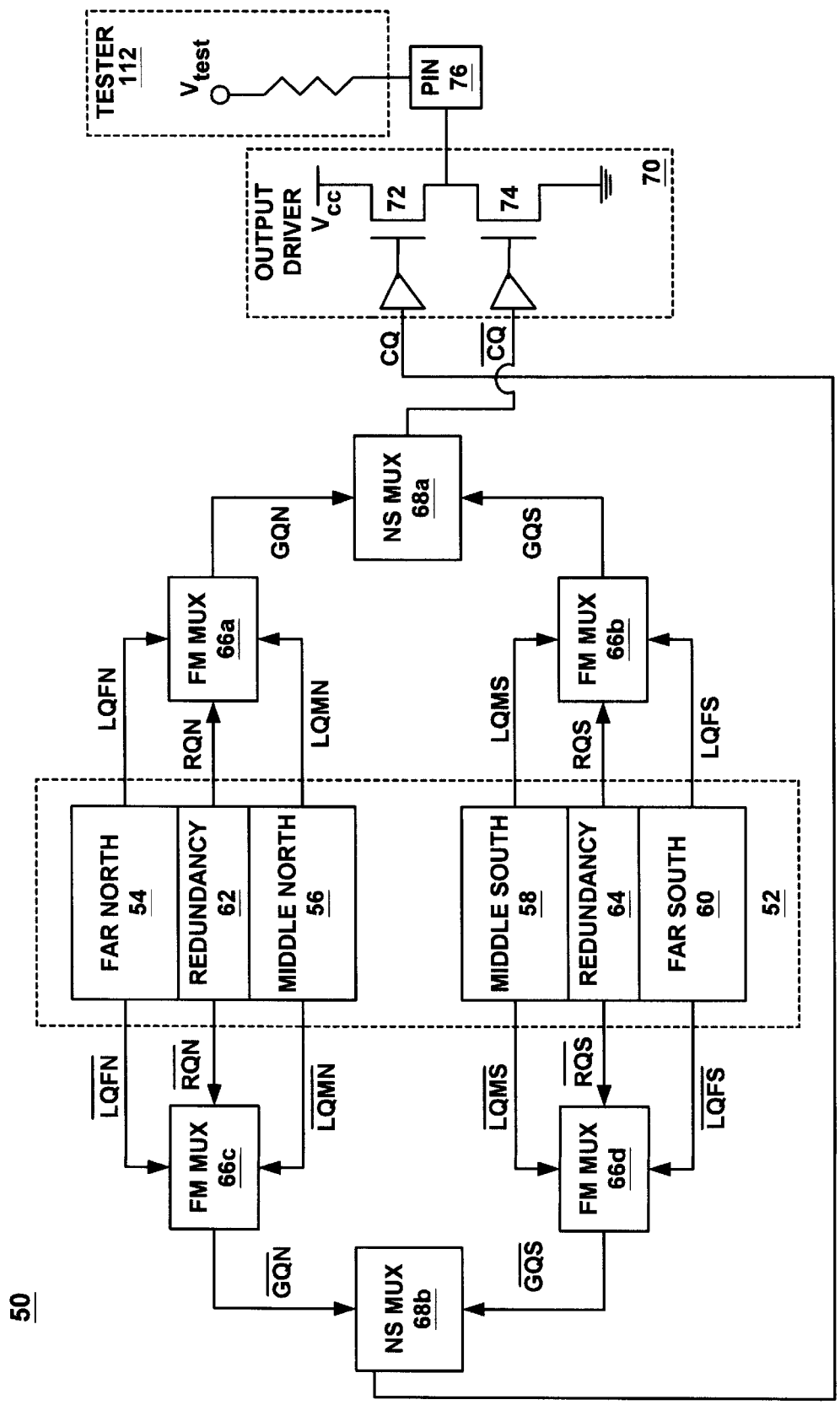
FIG. 2 illustrates a parallel test scheme for an asynchronous memory device having double-ended output data paths.
Figure 3:
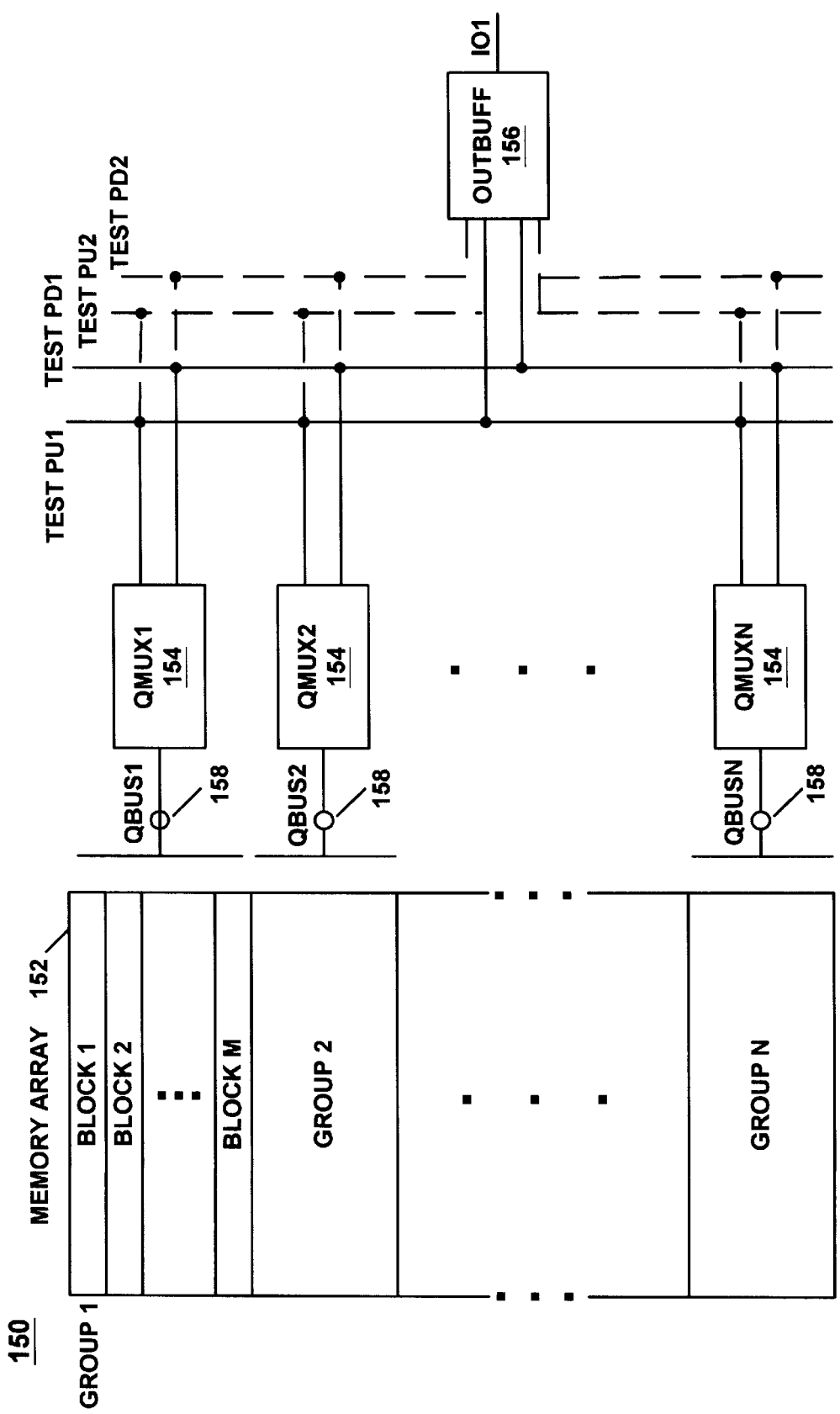
FIG. 3 illustrates a parallel test scheme for an asynchronous memory device having single-ended output data paths in accordance with one embodiment of the present invention.

FIG. 3 illustrates an asynchronous memory device 150 having a single-ended output data path configured in accordance with an embodiment of the present invention. Memory device 150 may be an asynchronous SRAM. Memory device 150 is configured with parallel test circuitry which, as indicated above, can significantly reduce the time required to test the memory cells thereof. In addition to providing functional testing of these cells, the parallel test circuitry of memory device 150 is configured to provide a measure of the access time of a slowest cell or bit. This is accomplished in this embodiment by utilizing the regular read path circuitry of memory device 150 during a parallel test operation. Such circuitry necessarily provides output signals from the memory array 152 of memory device 150 at the speed of a regular read operation and, therefore, necessarily allows for testing the access time of the memory device 150.

For this embodiment, memory device 150 includes a memory array 152 arranged as "N" number of groups of "M" blocks each. N and M may vary depending upon the address decoding scheme employed in memory device 150 and may, for example, be 16 and 8, respectively. In other embodiments, different values of N and M may be used and the precise arrangement of memory array 152 is not critical to the present invention. Also, memory array 152 may include various redundant rows and/or columns of memory cells which may be used to replace defective memory cells located in other areas of memory array 152. Although not shown in individual detail, it should be appreciated that memory array 152 is made up of a number of individual memory cells, which may be conventional SRAM cells.

During a parallel test operation, test data is "written" to selected cells of memory array 152 by simultaneously activating multiple memory cells, each in different groups, for example as described in U.S. Pat. No. 5,383,157. The data stored in selected cells of each group is then "read" out and compared to data read from adjacent memory groups. This provides the functional test-of the cells.

The circuitry for accomplishing this parallel test includes multiplexers (QMUX1–QMUXN) 154, output buffer (OUTBUFF) 156 and a pair of busses TESTPU1 and TESTPD1. In this context, the term multiplexer is used to describe the actions of the QMUXs 154, which receive logic signals from the selected cells under test (one in each of the blocks of the respective groups of memory array 152) on associated QBUSses 158 and provide output signals indicative of the logic states of these cells to the TESTPU1 and TESTPD1 busses. The QBUSses may be regarded as local, single-ended output data paths for the groups of memory array 152. The use of such local busses avoids the large capacitive loads that may otherwise be associated with a global data bus that receives outputs from each of the memory array groups. However, in other embodiments the use of such a global data bus may be implemented, provided drivers of a sufficient size are used at the outputs of the memory array 152.

Because the same data is written to the selected cells under test, the logic states of these cells should be the same when read by their respective QMUXs 154. That is, if a logic "1" is written to the selected cells, signals provided on the respective local data busses (QBUSses 158) should indicate that a "1" was stored in the selected cells when these signals are read by the associated QMUX 154 (at least if these selected cells are functioning properly). The output signals produced by each QMUX 154 to the TESTPU1 and TESTPD1 busses are also indicative of the logic states of the selected cells which provided the logic signal on the local QBUSses 158.

Where redundancy is used, any of the logic signals on a local QBUS 158 may be replaced by logic signals from redundant block of memory array 152. In such a case, corresponding logic signals produced by the QMUX coupled to the redundant memory cells will be provided to the TESTPU1 and TESTPD1 busses. Thus, the present parallel test scheme is transparent (from a user's pint of view) to redundancy.

As will be more fully described below, the QMUXes 154, in conjunction with the OUTBUFFers 156 include circuitry that, in response to the state of the logic signal received on the associated QBUS 158, pulls up (i.e., raises to a logic high or "1") the TESTPU1 and TESTPD1 buses (i.e., if the selected cell under test is read as storing a logic "1"), or pulls down (i.e., lowers to a logic low or "0") the TESTPU1 and TESTPD1 buses (i.e., if the selected cell under test is read as storing a logic "0"). In one embodiment, TESTPU1 may be kept at a logic high state and TESTPD1 may be kept at a logic low state when a parallel test is not in progress (i.e., when the selected cells are not being read). Then, during the test the state of these busses may be determined by the output signals from each of the QMUX 154 circuits. If during a test the TESTPU1 and TESTPD1 busses have the same state (i.e., either both logic 1 or both logic 0), the conclusion is that the test was successful and all the selected memory cells stored and read out the same data (as they should because the same data would be applied at the commencement of the test). If, however, the two busses are in different states, the conclusion is that an error condition has been encountered and the memory device 150 has failed the test.

By using a single pair of busses TESTPU1 and TESTPD1, "solid data" patterns (i.e., those in which each selected cell is written with a logic 1 or a logic 0) can be tested. By providing a second pair of busses TESTPU2 and TESTPD2 (as shown in dotted outline), a checkerboard data pattern (i.e., one in which the selected odd cells, corresponding to IO1, IO3, IO5 . . . are written with data of a first state, say logic 1, and the selected even cells, corresponding to IO2, IO4, IO6 . . . are written with data of the opposite logic state, say logic 0 can be tested. Hereafter, operations with respect to the use of solid data testing will be described, however, those of ordinary skill in the art should recognize that similar procedures may be used for checkerboard-type test operations employing all four test busses.

Figure 4:
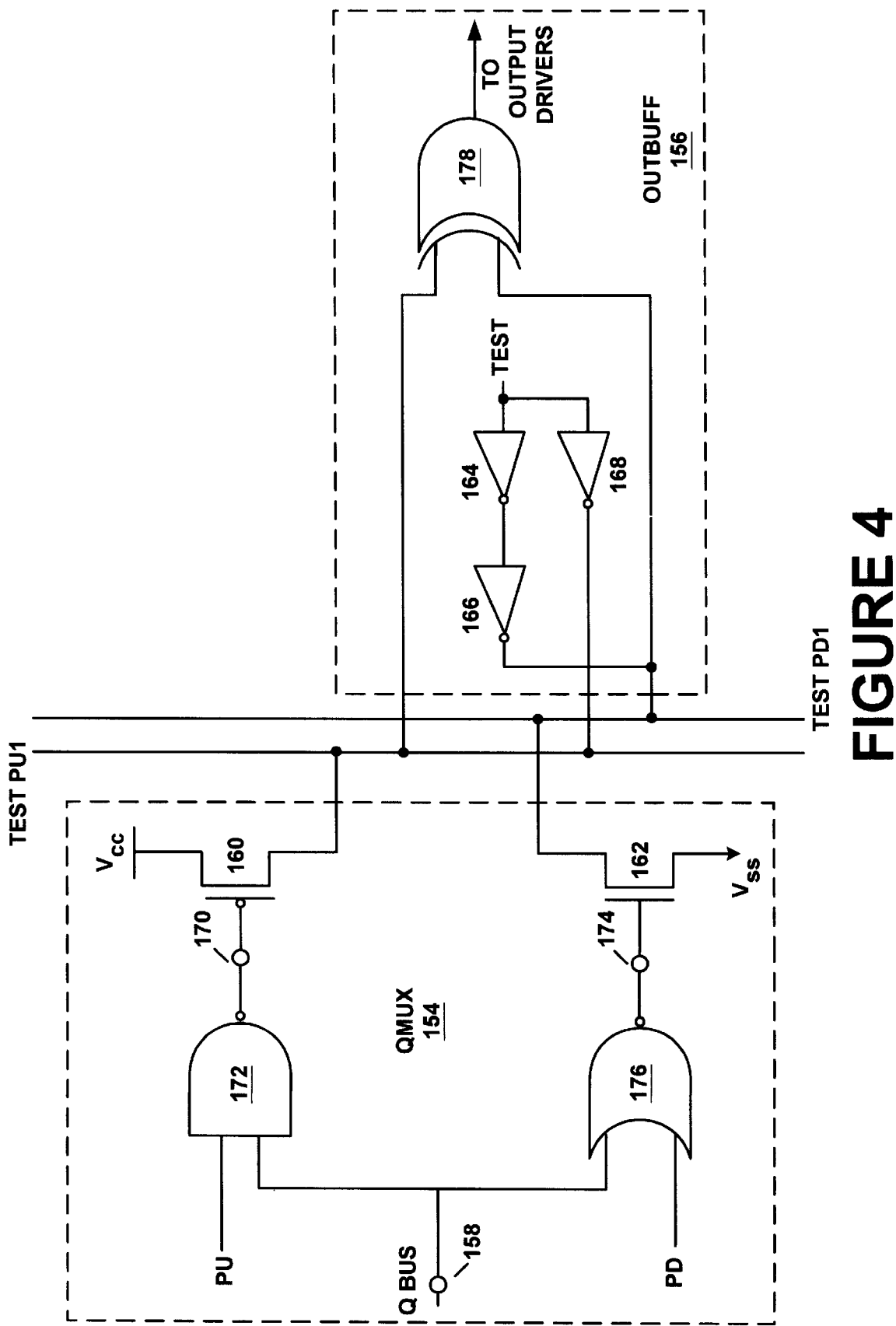
FIG. 4 illustrates further details of a QMUX and OUT-BUFF circuit for use in the parallel test scheme shown in FIG. 3.

FIG. 4 illustrates one embodiment of the relevant portions of a QMUX circuit 154 and OUTBUFF circuit 156. Portions of these circuits that may be devoted to purposes not directly associated with the parallel test operations described herein have been omitted so as not to unnecessarily complicate the drawing. QMUX circuit 154 operates such that each memory array area to be tested may drive the test busses TESTPU1 and TESTPD1 via transistors 160 and 163, respectively. Transistor 160 may be a PMOS transistor coupled between an operating voltage source (Vcc) and test bus TESTPU1, while transistor 162 may be an NMOS transistor coupled between ground (Vss) and test bus TESTPD1. Also connected to these test busses is the OUTBUFF circuit 156. Each test bus, together with the connecting circuitry, forms a "wired NAND and wired NOR" circuit.

While in normal operating mode (i.e., operating modes other than a parallel test), the TEST input is kept low, forcing TESTPU high and TESTPD low through the actions of inverters 164, 166 and 168. Thus, the test busses will maintain these states regardless of the data input from the QMUX circuit 154.

During parallel test mode, in a "write" cycle all memory array areas to be tested are enabled and are written with the same data (e.g., all logic 1s or logic 0s, assuming a solid data test and not a checkerboard data test is underway). During a subsequent "read" cycle, control signals PU and PD are asserted high and low, respectively, thus enabling the QMUX circuit 154, signal TEST is asserted high and data from the cell under test is read out on the associated QBUS 158. The inverters 164, 166 and 168 are very "weak" in comparison to transistors 160 and 162. That is, the transistors that make up these inverters are small as compared to transistors 160 and 162. For example, the p-channel transistors of inverters 164 and 166 may have a gate width-to-length (W/L) ratio of 4/0.55, while the n-channel transistors of these inverters may have a W/L ratio of 2/0.5. The p-channel transistor of inverter 168 may have a W/L ratio of 2/0.55, while its n-channel transistor may have a W/L ratio of 1.1/0.5. In contrast, transistor 160 may have a W/L ratio of 80/0.55 and transistor 162 may have a W/L ratio of 40/0.5. Accordingly, the actions of transistors 160 and 162 will dominate those of the weak inverters 164–166 and will pull high or low the test busses TESTPU1 and TESTPD1 according to the state of QBUS 158.

In the case of a logic 1 being read on QBUS 158, the subsequent output signal 170 from NAND gate 172 will be low, turning on transistor 160, which pulls TESTPU1 high. Also, output signal 174 from NOR gate 176 will be low, disabling transistor 162. TESTPD1 will be pulled high through the actions of signal TEST and inverters 164, 166 and 168. Thus, both TESTPU1 and TESTPD1 will be logic high.

In the case of a logic 0 being read on QBUS 158, the subsequent output signal 170 from NAND gate 172 will be high, disabling transistor 160. Also, output signal 174 from NOR gate 176 will be high, turning on transistor 162 and causing TESTPD1 to be pulled low. TESTPU1 will also be pulled low through the actions of signal TEST and inverters 164, 166 and 168. Thus, both TESTPU1 and TESTPD1 will be logic low.

Thus, if all bits read from the groups of memory array 152 connected to the same test busses agree, the TESTPU and TESTPD bus pairs are going to have the same state (00 or 11). The XOR circuit 178 in OUTBUFF 156 will consequently have its output driven to logic 0, providing an enable signal to the output drivers of memory device 150. If one or more bits disagree, however, TESTPU and TESTPD will be driven to opposite states, thus causing the output of XOR circuit 178 to be driven to logic 1, tri-stating the output drivers of memory device 150, indicating a failure of the parallel test.

In the above process, the output of OUTBUFF 156 is tri-stated by the fastest bit in the array and driven high or low by the slowest bit in the array. Hence, read cycle timing can be measured.

Thus, a parallel test scheme for an asynchronous memory device having a single-ended output data path has been described. Although the foregoing description was set forth with reference to certain illustrated embodiments, it should be appreciated that the present invention is in no way limited to these examples. For example, certain logic gates discussed with reference to the exemplary embodiments may be replaced with equivalent combinations of logic gates as is well known in the art. Accordingly, the invention should only be measured in terms of the claims which follow.

What is claimed is:

1. An asynchronous memory device comprising parallel test circuitry configured to interface with a single-ended output data path of the memory device and to provide a measure of a slowest cell access time for the memory device;

wherein the parallel test circuitry comprises:

first circuitry configured to receive logic signals from a plurality of cells of the memory device and to provide first output signals indicative of logic states of the plurality of cells, wherein the first circuitry comprises one or more circuits, each including an input path from a first number of the plurality of cells and configured to provide at least one of the first output signals; and second circuitry configured to receive the first output signals and to produce a second output signal indicative of the logic states of the first output signals therefrom, wherein the second circuitry includes an exclusive OR circuit coupled to receive the first output signals and to produce the second output signal.

2. The asynchronous memory device of claim 1 wherein at least one of the plurality of cells is included within a redundant row or column of the memory.

3. The asynchronous memory device of claim 1 wherein the first circuitry and the second circuitry are configured as a wired NAND and wired NOR combination.

4. Parallel test circuitry, comprising:

an input path configured to receive logic signals from cells of an asynchronous memory device having a single-ended output data path, wherein the input path comprises a plurality of logic gates coupled to receive logic signals from the cells and one or more internal control signals of the asynchronous memory device, and driver transistors coupled to the logic gates; and logic circuitry coupled to the input path and configured to produce an output signal indicative of logic states stored in the cells, wherein the logic circuitry comprises an exclusive OR gate.

\* \* \* \* \*